United States Patent [19]

Chan et al.

[11] Patent Number: 5,132,982
[45] Date of Patent: Jul. 21, 1992

[54] OPTICALLY CONTROLLED SURFACE-EMITTING LASERS

[75] Inventors: Winston K. Chan, Fair Haven; Ann C. Von Lehmen, Little Silver, both of N.J.

[73] Assignee: Bell Communications Research, Inc., Livingston, N.J.

[21] Appl. No.: 697,805

[22] Filed: May 9, 1991

[51] Int. Cl.$^5$ ............................................. H01S 3/19
[52] U.S. Cl. ..................................... 372/50; 372/45; 357/17; 357/19
[58] Field of Search ................. 372/50, 45; 357/17, 357/19

[56] References Cited

U.S. PATENT DOCUMENTS 4,833,511  5/1989  Sugimoto ............................ 372/50
4,949,350  8/1990  Jewell ................................. 372/45

FOREIGN PATENT DOCUMENTS 0103387  6/1984  Japan ................................. 357/19
0144889  7/1986  Japan ................................. 357/19

OTHER PUBLICATIONS

J. Katz et al. "A monolithic integration of GaAs/GaAlAs bipolar transistor and heterostructure laser," *Applied Physics Letters*, Jul. 1980, vol. 37(2), pp. 211–213.

N. Bar-Chaim et al. "Monolithic integration of a GaAlAs buried-heterostructure laser and a bipolar phototransistor," *Applied Physics Letters*, Apr. 1982, vol. 40, pp. 556–557.

W. K. Chan et al, "Optically Controlled Surface Emitting Lasers," *Technical Digest International Electron Devices Meeting Proceedings*, Dec. 1990, pp. 6.9.1–6.9.3.

G. R. Olbright et al, "Cascadable laser logic devices: Discrete integration of phototransistors with surface-emitting laser diodes," *Electronics Letters*, Jan. 1991, vol. 27, pp. 216–217.

T. Numai et al, "Surface-emitting laser operation in vertical-to-surface transmission electrophotonic devices with a vertical cavity," *Applied Physics Letters*, Mar. 1991, vol. 58, pp. 1250–1252.

*Primary Examiner*—Georgia Y. Epps
*Attorney, Agent, or Firm*—Leonard Charles Suchyta; Charles S. Guenzer

[57] ABSTRACT

An optically controlled vertical-cavity, surface-emitting laser comprising a heterojunction, bipolar phototransistor epitaxially grown on a substrate and a vertical-cavity, surface-emitting laser epitaxially grown on the photo-transistor. Two electrodes set up a single current path through the laser and photo-transistor. A controlling optical beam selectively illuminates the photo-transistor to turn it on, open the current path through the laser, and causing the laser to emit light. Dependent upon the electrical biasing conditions, the combination device can be used as an optical amplifier or can be made to optically latch. Further, it can be biased to operate as an AND or OR gate.

15 Claims, 4 Drawing Sheets

OPTICALLY CONTROLLED SURFACE-EMITTING LASERS

FIELD OF THE INVENTION

The invention relates generally to semiconductor lasers. In particular, the invention relates to a surface-emitting laser integrated with a photo-transistor for controlling the laser.

BACKGROUND ART

Vertical-cavity, surface-emitting lasers of the sort disclosed by Jewell et al. in U.S. Pat. No. 4,949,350 offer many advantages for use in optical processing. Two-dimensional, addressable arrays of these lasers can be inexpensively fabricated on a single substrate and can provide many parallel channels. To data, such arrays have been addressed only electrically. Matrix-type electrical addressing allows large arrays to be addressed but is incompatible with the independent and simultaneous addressing needed for general optical processing. Independent and simultaneous electrical addressing requires an electrical connection for each of the lasers, thus limiting the size of the array.

Optically controlled light sources have been implemented for edge-emitting lasers and light-emitting diodes (LEDs), as has been disclosed by Katz et al. in "A monolithic integration of GaAs/GaAlAs bipolar transistor and heterostructure laser," *Applied Physics Letters,* volume 37, 1980, pp. 211–213 and by Bar-Chaim et al., in "Monolithic integration of a GaAlAs buried-heterostructure laser and a bipolar phototransistor," ibid., volume 40, 1982, pp. 556–557. However, the one-dimensional geometry of these devices makes it very difficult to adapt this approach to two-dimensional arrays exhibiting optical gain.

SUMMARY OF THE INVENTION

Accordingly, an object of the invention is to provide an optically controlled surface-emitting laser.

A further object of the invention is to provide a two-dimensional array of optically controller lasers.

A yet further object of the invention is to provide such optically controlled lasers which would be useful in optical processors.

The invention can be summarized as an integrated combination of a vertical-cavity, surface-emitting laser joined end-to-end with a photo-transistor and serially biased with it such that light shining on the photo-transistor can cause the laser to turn on. Sufficiently high electrical biasing and intensity of the controlling light will cause the combination photo-transistor/laser to latch so as to continue outputting light even after the triggering light has ceased, that is, to act as a two-terminal optical thyristor. The device can further be operated as an optical logical device outputting a beam in logical correspondence to the levels of multiple input beams.

DETAILED DESCRIPTION OF THE PREFERRED EMBODIMENTS

Figure 1:
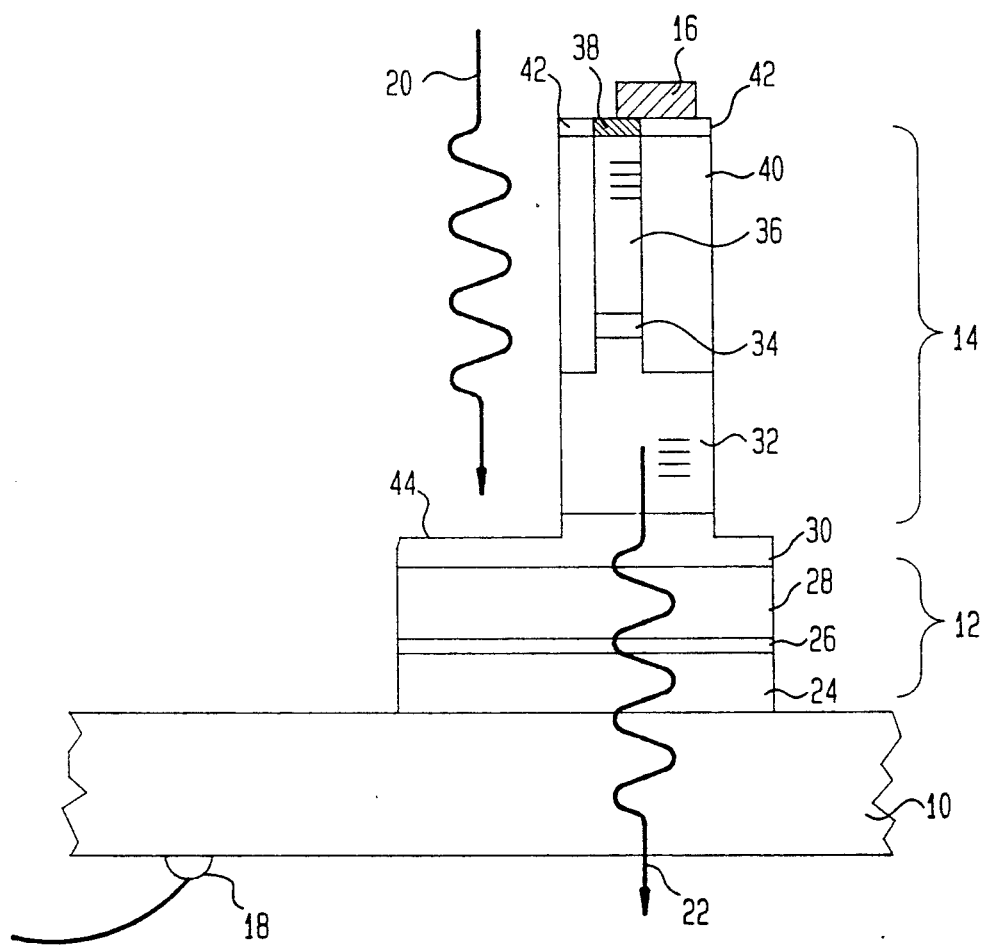
FIG. 1 is a cross-sectional view of a first embodiment of the surface-emitting laser and photo-transistor of the invention.

A first embodiment of the invention is illustrated in cross-section in FIG. 1 and comprises an $n^+$ GaAs substrate 10 on which is formed an $n^+$—p-n heterojunction photo-transistor 12 with its emitter side down. A vertical-cavity, surface-emitting diode laser 14 having the shape of a pillar is formed on the photo-transistor 12. The active region of the laser 14 emits light to which the photo-transistor 12 is transparent. The laser 14 is epitaxial with the photo-transistor 12 and with the substrate 10. An electrical contact 16 is attached to the top of the pillar and a common contact 18 is attached to the substrate 10. When optical control of the laser 14 is desired, electrical bias is applied across these contacts 16 and 18 that is insufficient to cause the laser 14 to lase when the photo-transistor 12 is left turned off. However, when light 20 impinges upon the photo-transistor 12 under these bias conditions, the photo-transistor 12 is turned on, significant current flows through the laser 14, it lases, and laser light 22 is emitted through the photo-transistor 12 and out through the bottom of the substrate 10. This work has been published by Chan et al. in "Optically Controlled Surface Emitting Lasers,"-'*Technical Digest International Electron Devices Meeting,* 1990, pp. 6.9.1–6.9.3. A discrete version of an optically controlled vertical-cavity laser was disclosed by Olbright et al. in "Cascadable laser logic devices: discrete integration of phototransistors with surface-emitting laser diodes,"*Electronics Letters,* volume 27, 1991, pp. 216–217.

EXAMPLE

An example of the laser and photo-transistor of FIG. 1 was fabricated by molecular beam epitaxy and then tested. The substrate 10 had an (100) orientation and was doped to $\sim 1\times 10^{18}$ cm$^{-3}$ with Si. The photo-transistor 12 consisted of an n-type, 250 nm thick emitter 24 of $Al_{0.3}Ga_{0.7}As$ doped to $5\times 10^{17}$ cm$^{-3}$ with Si, a p-type, 100 nm thick base 26 of GaAs doped to $5\times 10^{f}$cm$^{-3}$ with Be, and an $n^-$-type, 700 nm thick collector 28 doped to $7\times 10$ cm$^{-3}$ with Si. The photosensitive regions are the base 26 and the depletion region between the collector 28 and base 26. To increase the depletion region for maximum photosensitivity, the collector 28 was doped as lightly as could be reliably controlled, and the base 26 was adequately doped to avoid punch-through. The photo-transistor 12 and laser 14 were interconnected through a 500 nm thick window layer 30 of $n^+Al_{0.3}Ga_{0.7}As$ doped $2\times 10^{18}$ cm$^{-3}$ with Si. The window layer 30 is transparent to the laser light 22 but acted as an etch stop for forming the pillar of the laser 14.

The vertical-cavity, surface-emitting layer 14 was a standard structure having a lower Bragg reflector 32 of twenty periods of n-type AlAs and GaAs quarter-wavelength layers, an active region 34 consisting of three 8 nm thick quantum wells of $In_{0.2}Ga_{0.8}As$ and 10 nm thick GaAs barriers, all undoped, and an upper Bragg reflector 36 of twelve periods of p-type AlAs and GaAs quarter-wavelength layers. The quantum wells emit light ($\lambda=958$ nm) of an energy less than the bandgap of all other layers so they are transparent to the lasing light. In order to reduce the electrical resistance of the reflectors 32 and 36, their AlAs/GaAs interfaces were graded with superlattices. The structure had 521 layers and was 7.6 μm thick. The details of the fabrication and laser structure are described in Jewell et al.

The lateral definition began by patterning a 10μm×10 μm gold contact 38 on the top or p-type side of the laser 14. Although only a single laser 14 and photo-transistor 12 are illustrated in FIG. 1, a two-dimensional array was fabricated. A proton implantation using the gold contact 38 as a self-aligned mask produced an isolation region 40 extending to below the active region 34. The implantation followed the procedure disclosed by Orenstein et al. in U.S. Pat. No. 5,031,187. An insulating layer 42 of $SiO_2$ was deposited, and a portion of it was etched through to expose the gold contact 38. The contact pad 16 of Ti/Au wad deposited and patterned to contact the gold contact 38. At this point, the structure remained fairly planar. Photoresist was defined to cover the area of about 25 μm×25 μm of the laser pillar. Argon ion milling at 500 keV using the photoresist as a mask continued into the window layer 30, thereby exposing a window area 44 for the photo-transistor 12 to receive the input light 20. A further photoresist layer was defined to cover the area of either a 100 or 200 μm square over the photo-transistor 12. Further argon ion milling continued at least past the base 26 in order to isolate the array of photo-transistors 12. Finally, the back of the substrate 10 was thinner, polished, and the common counter electrode 18 was contacted with In.

The integrated device was tested with the laser 14 being forward biased, that is, positive DC voltage applied to the p-side electrode 16 relative to the n-side electrode 18. The input light 20 was either directly illuminated by an Ar ion laser at 488 nm or illuminated by fiber-coupled light from a Ti:sapphire laser at 855 nm or a HeNe laser at 633 nm. A large area Si photodiode was positioned a few millimeters below the substrate 10 to monitor the output light 22. The photo-transistor 12 responded to all of these input wavelengths but with lower responsivity at shorter wavelengths because of absorption by the $Al_{0.3}Ga_{0.7}As$ window layer 30.

Several distinct modes of operation were observed. The laser was below threshold when the electrical bias and the power of the controlling input light 20 were low. With more control light 20, the device amplified the control light 20 at low bias, but at high bias (>8 V) the laser 14 latched and remained on even after the control light 20 was turned off. Between the amplifying and latching modes, there existed a region of bistability whose state of amplifying or latching depended on the history. With sufficiently high bias voltages (>14-16 V), no control light 20 was needed to latch the laser 14 in the on state. Therefore, the optical energy needed for latching can be made arbitrarily small by biasing arbitrarily close to the spontaneously latching bias levels.

Figure 2:
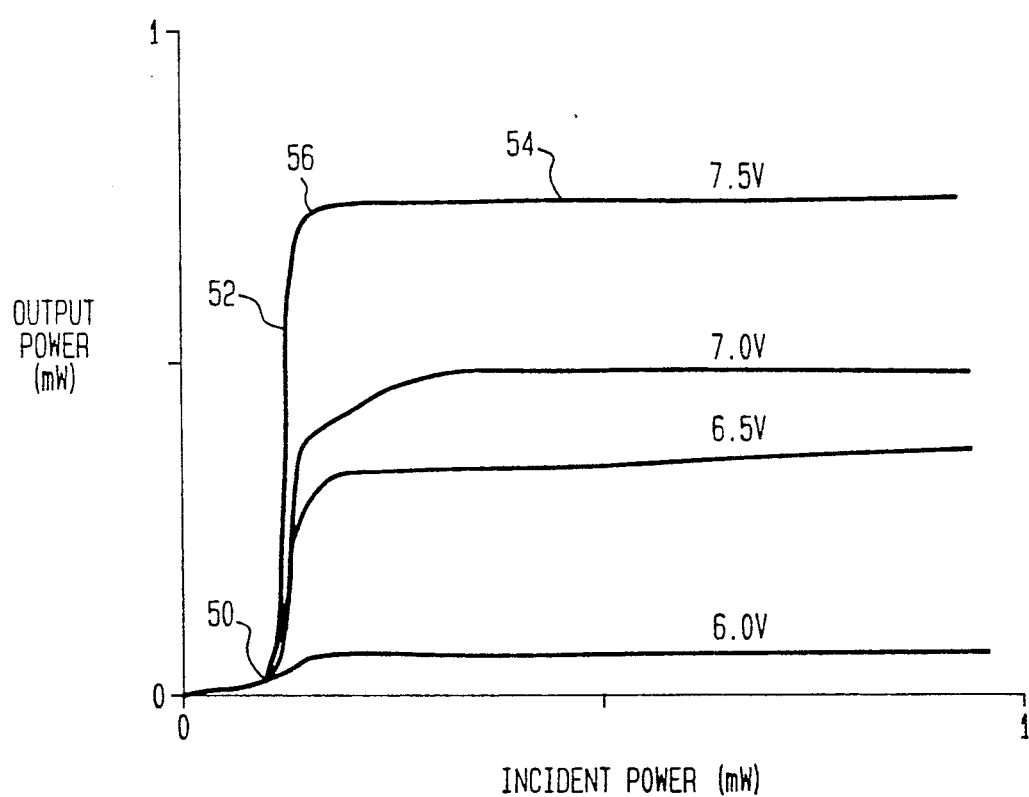
FIG. 2 is a graph illustrating the optical gain characteristics of the laser and photo-transistor of the first embodiment.

The amplifying characteristics are presented in FIG. 2 relating optical output power to optical input power for several electrical biasing levels. The dark current was less than 100 nA. A laser threshold 50 was attained with about 110 μW of incident optical power. After a region 52 of high differential gain, the output power saturated at a value 54 dependent upon the bias. The knee 56 of the curve for the highest bias level corresponded to an external optical power gain of 5.

Figure 3:
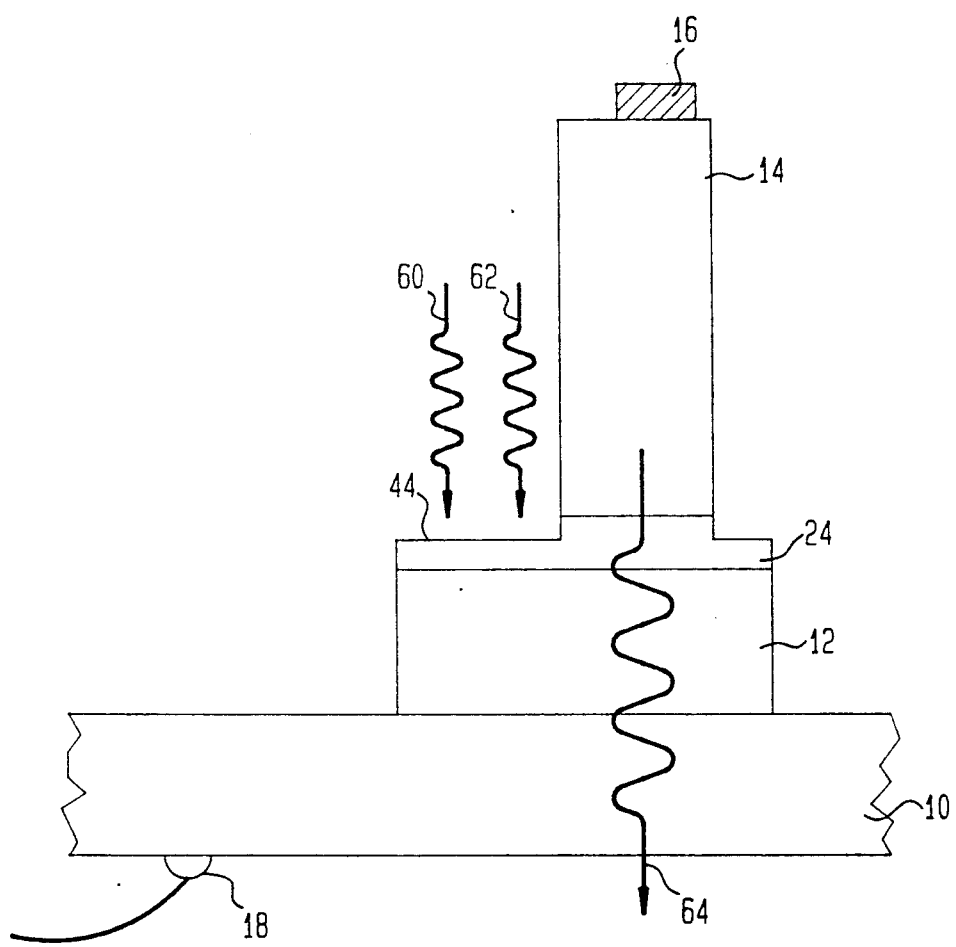
FIG. 3 is a cross-sectional view of a variation of the first embodiment adapted to act as a logic device.

With an understanding of the characteristics of FIG. 2, the device of FIG. 1 can be used as either of the principal logical devices, an AND gate or an OR gate. With double-rail logic, only an AND gate is required for any Boolean function. As illustrated in FIG. 3, two input beams 60 and 62 selectively illuminate the window 44 to the photo-transistor 12. To operate the device as an AND gate, each of the input beams 60 and 62 has an off-power level of zero and an on-power level set below the voltage-dependent threshold level 50, but the sum of the two high power levels is above the threshold level 50. Accordingly, the device will output a high level output beam 64 only if both the input beams 60 and 62 are at high levels. The on-to-off output power ratio of the AND gate is 10:1. Since spontaneous emission dominates the off-state, spatial and spectral filtering should increase this ratio. Similarly, the device can be operated as an OR gate if each of the input beams 60 and 62 has an on-power level above the threshold level 50. If either or both input beams 60 and 62 are on, the output beam 64 is on. Because of the wide saturation region 54, the optical output 64 is relatively independent of whether one or both of the input beams 60 and 62 is on. The concept can be easily extended to AND and OR gates having more than two inputs. Furthermore, the biasing point can be kept near to the spontaneous latching bias so that the AND or OR gate is operated in the latching mode.

Because the device of FIG. 3 can be easily replicated in a two-dimensional array, it presents interesting possibilities for image processing. For example, each of the optical thyristors in a two-dimensional array could be operated as an AND gate. If two images are presented to the array, only in the overlapping areas will the AND gates produce an optical output.

Figure 4:
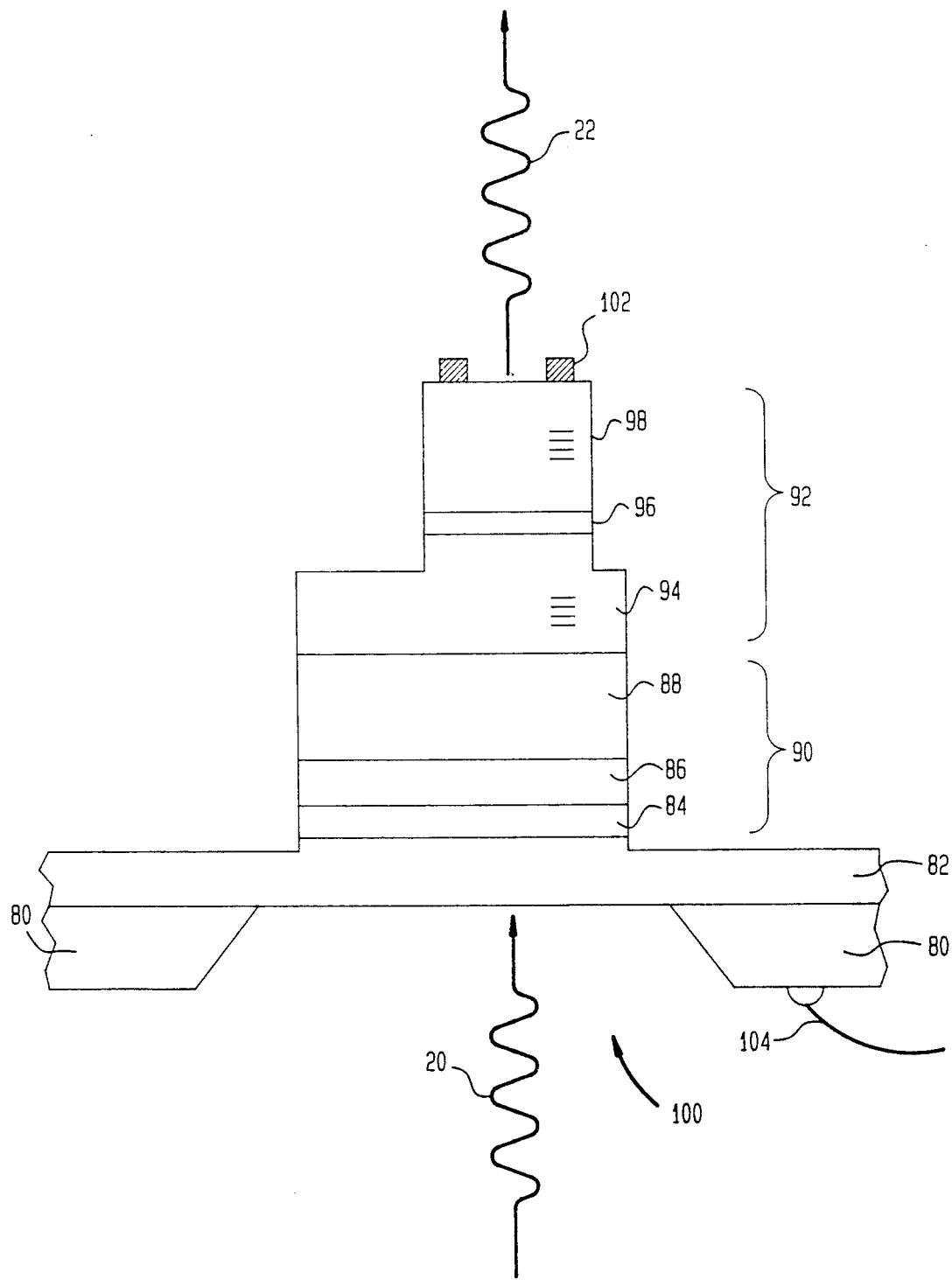
FIG. 4 is a cross-sectional view of a second embodiment of the invention.

The coupled laser and photo-transistor of FIG. 1 were controlled by shorter wavelength radiation than was emitted. The different wavelengths allowed the lasing light to traverse the photo-transistor, which was absorbing the controlling light. If these devices are to be used in a multi-stage optical processor, they should be controlled and emit at the same wavelength. An example of such an optically controlled laser is illustrated in the cross-section of FIG. 4 and is based on the GaAs material family so that it emits and absorbs in the near infrared.

The structure is grown on an n-type GaAs substrate 80. Over the substrate 80 is deposed a window layer 82 of n-type AlGaAs or InGaP that is lattice matched to GaAs and is transparent to the wavelength of interest. Over the window layer 82 are grown an emitter layer 84 of n-type AlGaAs, a base layer 86 of p-type GaAs, and an interconnect layer 88 of n-type GaAs. The emitter, base, and interconnect layers 84, 86, and 88 together form a photo-transistor 90 because the interconnect layer 88 is acting as a collector. However, a further function of the GaAs interconnect layer 88 is to absorb any remaining portion of the lasing light emitted from the GaAs active region of an overlying laser 92. For transistor action, the interconnect layer 88 could be eliminated because the lowest portion of the laser is 92 n-type.

The laser 92 consists of a lower n-type Bragg mirror 94, an active layer 96 of GaAs, and an p-type upper Bragg mirror 98. Both mirrors 94 and 98 comprise multiple alternating quarter-wavelength layers of AlAs and AlGaAs. The GaAs vertical-cavity, surface-emitting laser 92 by itself is fairly conventional. A double masking and etching sequence is used to form a narrow upper laser pillar of a few micrometers diameter and extending to just below the active layer 96, and a wider photo-transistor mesa extending to below the base layer 86.

After the etching on the upper side of the substrate 80, its lower side is selectively etched through with the window layer 82 acting as an etch stop so as to form a back-side window 100 allowing the controlling light 20 to irradiate the photo-transistor 90. An annular contact 102 on the top of the laser pillar provides the upper electrode but allows laser light 22 to be emitted. A lower electrode 104 is attached to the substrate 80.

When the photo-transistor 90 and laser 92 are electrically biased by the electrodes 102 and 104 near the laser threshold, controlling light 20 above an optical threshold will turn on the photo-transistor 90 and cause the laser 92 to lase, producing output light 22 of nominally the same wavelength as the input light 20. Of course, these devices may be arranged in arrays on an opto-electronic integrated circuit chip. Further, several of these chips may be arranged in parallel to form a cascadable optical processing system.

A transistor provides gain for the controlling light and thus is the preferred control device for the laser. However, other photoactivated devices may be substituted for the photo-transistors, for example, an avalanche photo-diode or a p-i-n diode having a large intrinsic region for photo-detection. These devices have only a single p-n junction so that the optically controlled laser diode integrated with either of them has only two p-n junctions.

Although in the described embodiments, the phototransistor or at least its window layer was epitaxially deposited on the substrate, other crystalline bodies, such as an epitaxial layer, may be formed between the transistor and the substrate.

The optically controlled laser of the invention thus allows many types of complex optoelectronic circuits to be implemented in a simple and inexpensive manner. The optical control is particularly advantageous when images are being processed.

What is claimed is:

1. An optically controlled laser, comprising:
   a crystalline body;
   a photo-activated semiconductor device formed epitaxially with and vertically over a first area of said crystalline body and having at least one p-n junction and an optical receiving area for receiving a beam of light for activating said semiconductor device; and
   a vertical-cavity, surface-emitting laser formed epitaxially with and vertically over said first area of said crystalline body.

2. An optically controlled laser as recited in claim 1, further comprising a pair of electrodes for establishing an electrical path through both of said photo-activated device and said surface-emitting laser.

3. An optically controlled laser as recited in claim 1, wherein said photo-activated semiconductor device comprises a bipolar photo-transistor and said beam controls a base of said photo-transistor.

4. An optically controlled laser as recited in claim 3, wherein said surface-emitting laser is formed vertically over said photo-transistor.

5. An optically controlled laser as recited in claim 4, wherein said vertical-cavity laser is formed vertically over a second area of said crystalline body larger than said first area, whereby said photo-transistor has a larger cross-section than a cross-section of said surface-emitting laser.

6. An optically controlled laser as recited in claim 5, wherein said receiving area is disposed on an upper side of said photo-transistor.

7. An optically controlled laser as recited in claim 4, wherein said receiving area is disposed on a lower side of said photo-transistor.

8. An optically controlled laser as recited in claim 4, wherein said crystalline body comprises a substrate including an optical window formed therein below said photo-transistor.

9. An optically controlled vertical-cavity laser, comprising:
   a substrate;
   a vertical-cavity, surface-emitting laser formed at least partially epitaxially with and over a first area of said substrate;
   a vertically arranged photo-transistor formed epitaxially with and over said first area of said substrate and having a window area for receiving a controlling optical beam to selectively turn on said photo-transistor, said surface-emitting laser and transistor being electrically connected on respective first horizontally extending sides; and
   first and second electrodes attached to respective second horizontally extending sides of said surface-emitting laser and photo-transistor vertically opposite corresponding ones of said first sides, wherein a current path is set up through said surface-emitting laser and said photo-transistor and an amount of current on said path is controlled by said controlling optical beam, thereby causing a change in optical emission from said surface-emitting laser.

10. A laser as recited in claim 9, wherein said surface-emitting laser is formed over a second area of said photo-transistor smaller than said first area and said window area overlies said first area but not said second area.

11. A laser as recited in claim 9, further comprising a window layer disposed between said photo-transistor and said surface-emitting laser, said window area overlying said window layer.

12. An optical logical device as recited in claim 9, wherein said window area receives a plurality of selectively valued optical beams, a biasing voltage applied across said electrodes causing said surface-emitting laser to output an output beam as a logical combination of said selectively valued optical beams.

13. A laser array comprising a two-dimensional array of said surface-emitting lasers, photo-transistors, and first electrodes as recited in claim 9.

14. An optically controlled lasing structure, comprising an epitaxial structure having a first semiconducting layer of a first conductivity type, a second semiconducting layer of a second conductivity type, a third semiconducting layer of said first conductivity type, arranged in the stated order, an optical cavity being formed at least partially within said epitaxial structure and including an active region for emitting light resonant within said optical cavity, a photo-activated semiconducting device being formed in said structure and including a light window for receiving input light on one of said layers forming a light detecting region of said photo-activated semiconducting device, biasing electrodes being electrically connected to said epitaxial structure for serially biasing all three of said layers.

15. An optically controlled lasing structing as recited in claim 14, wherein said epitaxial structure comprises said first, second, and third layers and a fourth semiconducting layer of said second conductivity type, arranged in the stated order, said biasing electrodes serially biasing all four of said layers, said photo-activated semiconducting device comprising a photo-transistor.

* * * * *

UNITED STATES PATENT AND TRADEMARK OFFICE
CERTIFICATE OF CORRECTION

PATENT NO. : 5,132,982

DATED : July 21, 1992

INVENTOR(S) : Winston K. Chan and Ann C. Von Lehmen

It is certified that error appears in the above-identified patent and that said Letters Patent is hereby corrected as shown below:

Column 1, line 18, "data" should read --date--.
Column 2, line 44, "$5 \times 10 \int cm^{-3}$" should read --$5 \times 10^{17} cm^{-3}$--;
         line 45, "$7 \times 10\ cm^{-3}$" should read --$7 \times 10^{15} cm^{-3}$--;
         line 57, "layer" should read --laser--.
Column 3, line 15, "wad" should read --was--;
         line 28, "thinner" should read --thinned--.
Column 4, line 44, "deposed" should read --deposited--.
Column 6, line 61, "structing" should read --structure--.

Signed and Sealed this

Tenth Day of August, 1993

*Attest:*

MICHAEL K. KIRK

*Attesting Officer*      *Acting Commissioner of Patents and Trademarks*